United States Patent
Carel

(10) Patent No.: US 10,462,906 B2
(45) Date of Patent: Oct. 29, 2019

(54) FLEXIBLE PRINTED CIRCUIT

(71) Applicant: Alain Carel, Vancouver (CA)

(72) Inventor: Alain Carel, Vancouver (CA)

( * ) Notice: Subject to any disclaimer, the term of this patent is extended or adjusted under 35 U.S.C. 154(b) by 0 days.

(21) Appl. No.: 16/068,976

(22) PCT Filed: Jan. 27, 2017

(86) PCT No.: PCT/CA2017/050102
§ 371 (c)(1),
(2) Date: Jul. 10, 2018

(87) PCT Pub. No.: WO2017/127943
PCT Pub. Date: Aug. 3, 2017

(65) Prior Publication Data
US 2019/0029116 A1 Jan. 24, 2019

(30) Foreign Application Priority Data
Jan. 29, 2016 (CA) ..................... 2919293

(51) Int. Cl.
*H05K 1/18* (2006.01)
*H05K 1/11* (2006.01)
*H05K 3/46* (2006.01)

(52) U.S. Cl.
CPC ............ *H05K 1/189* (2013.01); *H05K 1/118* (2013.01); *H05K 3/4685* (2013.01); *H05K 2201/051* (2013.01); *H05K 2201/053* (2013.01); *H05K 2201/10128* (2013.01)

(58) Field of Classification Search
USPC ........................................................ 361/749
See application file for complete search history.

(56) References Cited

U.S. PATENT DOCUMENTS

| 3,565,462 A | 2/1971 | Gottlieb |
| 4,735,678 A | 4/1988 | Mandigo et al. |
| 2008/0048817 A1* | 2/2008 | Mahawili ............. H02K 3/26 336/206 |

(Continued)

FOREIGN PATENT DOCUMENTS

| GB | 2 2003 905 A | 10/1988 |
| WO | 2011/156765 A2 | 12/2011 |

OTHER PUBLICATIONS

Written Opinion filed in corresponding PCT Application No. PCT/CA2017/050102 dated Mar. 16, 2017.

(Continued)

*Primary Examiner* — Andargie M Aychillhum
(74) *Attorney, Agent, or Firm* — Davis & Bujold PLLC; Michael J. Bujold

(57) ABSTRACT

A flexible printed circuit is described that includes a flexible supporting substrate having a first face and a second face. A conductive material is deposited by vacuum deposition on at least one of the first face or the second face of the flexible supporting substrate. A flexible conductive circuit is formed on the conductive material by electrical discharge machining. The flexible conductive circuit defines a plurality of electrical component placement circuits to which electrical components may be attached. The flexible printed circuit can be rolled or folded. The flexible printed circuit can also be made in sizes much larger than is currently possible with other competing technologies.

28 Claims, 19 Drawing Sheets

(56) References Cited

U.S. PATENT DOCUMENTS

2012/0315773 A1    12/2012  Esquivel et al.
2016/0260836 A1*   9/2016   Okazaki ............... H01L 29/045

OTHER PUBLICATIONS

International Search Report filed in corresponding PCT Application No. PCT/CA2017/050102 dated Mar. 16, 2017.
International Preliminary Report on Patentability filed in corresponding PCT Application No. PCT/CA2017/050102 dated Dec. 6, 2017.

* cited by examiner

Figure 13
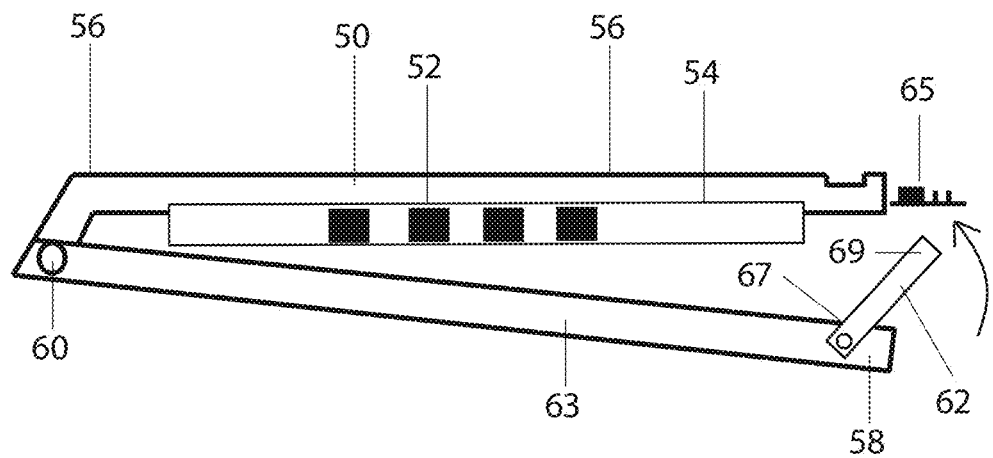
Figure 13A
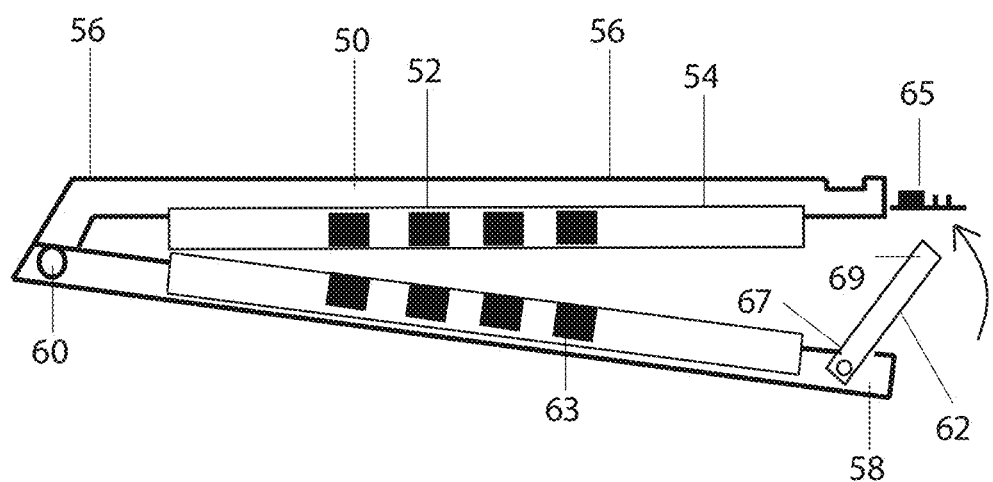
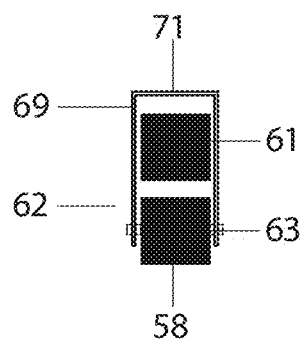
Figure 13B

FLEXIBLE PRINTED CIRCUIT

FIELD

There is described a flexible printed circuit that was developed for a point of purchase display stand. It is now realized that this flexible printed circuit has application beyond point of purchase display stands due to some unique properties that will hereinafter be further described.

BACKGROUND

Point of Purchase (POP) electrical stand-up displays are typically constructed by cutting a small hole out through rigid cardboard that has been imprinted with graphics. An LED is then manually pushed through the hole, so the LED protrudes from a front of the cardboard and is secured in place with tape positioned at a back of the cardboard. A conductive wire extends to a power transformer box, which is attached to the back of the cardboard by double sided adhesive tape. A power cord is run from the power transformer box to an external power outlet in a wall. When activated, the LED blinks on and off.

SUMMARY

There is provided a flexible printed circuit that includes a flexible supporting substrate having a first face and a second face. A conductive material is deposited by vacuum deposition on at least one of the first face or the second face of the flexible supporting substrate. A flexible conductive circuit is formed on the conductive material by electrical discharge machining. The flexible conductive circuit defines a plurality of electrical component placement circuits to which electrical components may be attached.

There are a number of unique aspects to the flexible printed circuit described above. One aspect is the flexibility. The flexible supporting substrate with flexible conductive circuit has a planar operative position and has a stored position in a roll configuration, such that the flexible supporting substrate with conductive circuit can be rolled and unrolled at will to move between the operative position and the stored position. Alternatively, the flexible supporting substrate with conductive circuit can have a planar operative position and a stored position in a folded configuration, such that such that the flexible supporting substrate with conductive circuit can be folded and unfolded at will to move between the operative position and the stored position.

Another important aspect is with respect to potential sizes. A size of approximately 14 inches×16 inches is the largest cost effective area that a flexible printed circuit board can currently be manufactured using current technology. There is no such size limitation with the present invention, a flexible printed circuit can be custom made to virtually any size.

There are some further innovative features that were developed to work with the flexible printed circuit and will hereinafter be further described.

One issue that had to be dealt with was how to attach extremely small high tolerance electrical components to a large flexible conductive circuit. This was accomplished through the use of registration placement circuits. Placement circuits are miniature circuits that are polyimide film with etched copper circuits or silver printed polyester circuit that the miniature electrical surface mount components are attached to. The use of placement circuits requires two or more points of electrical contact to the conductive circuit.

One form of connector for connecting electrical components to the placement circuits is a "butterfly" connector; so called due to it's shape. Each butterfly connector has a body with a central portion and opposed wings. The body of the butterfly connector is etched with a conductive circuit. The electrical component is positioned on the central portion. The wings are then attached to the flexible conductive circuit with a conductive film adhesive.

Another issue that had to be dealt with was how to connect the flexible conductive circuit to a power source. As will hereinafter be further described with reference to drawings, a connection interface is provided in the form of a conductive cloth or metal foil with a conductive adhesive backing secured along an edge of the conductive circuit to create a flexible contact tab area.

While there are various ways to connect to the flexible contact tab area, a further innovation involves connection to the connection interface by means of a removable clamp. As will hereinafter further described and illustrated with reference to drawings, the clamp is lined with a malleable non-conductive material that supports contact areas By closing the clamp over the connection interface, pressure from the clamp completes an electrical connection between the connection interface and the contact areas of the clamp.

Another method of connection developed was the use of grommets that clinch through the substrate and make contact with the flexible circuit. These grommets can both serve to mount the substrate to a support and also serve to make electrical contact.

A further issue that had to be dealt with was the crossing of conductive pathways on the conductive circuit. As will be hereinafter further described with reference to drawings, this was accomplished by spot positioning a bridge of a dielectric insulating layer over one of the conductive pathways, with a conductive cross-over path crossing the conductive pathway via the bridge.

With the application of POP displays, the conductive circuit was connected to one or more lighting components. A graphic overlay sheet was then positioned over the conductive circuit. The graphic overlay sheet has one or more windows. Each lighting component is aligned with one of the windows, such that light from each lighting component is visible through the graphic overlay sheet.

The properties of the graphic overlay sheet may vary. As will hereinafter be further illustrated and described with reference to drawings, the graphic overlay sheet may be flexible, rigid or rigid but segmented to facilitate folding.

Some examples of alternative applications for signage or decals is also illustrated and described, to show applications beyond POP displays.

BRIEF DESCRIPTION OF THE DRAWINGS

These and other features will become more apparent from the following description in which reference is made to the appended drawings, the drawings are for the purpose of illustration only and are not intended to be in any way limiting, wherein:

FIG. 11A is a section view of FIG. 11

FIG. 13 is a side elevation view of a connector bar from the POP display illustrated in FIG. 1, with conductive contacts along one arm.

FIG. 13A is a side elevation view of a connector bar with conductive contacts along both arms.

FIG. 13B is an end elevation view of the connector bar of FIG. 13.

DETAILED DESCRIPTION

Figure 1:
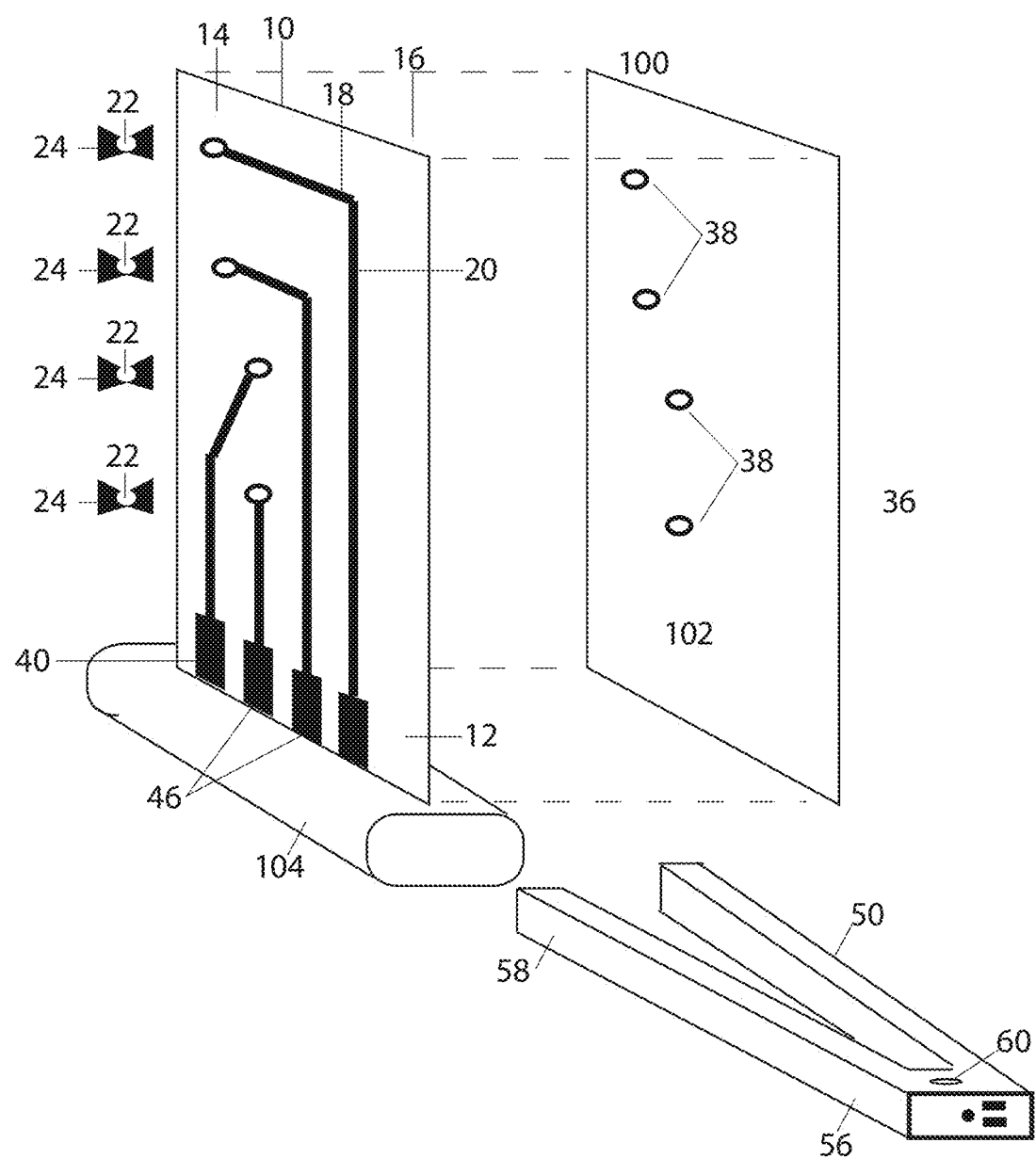
FIG. 1 is an exploded perspective view of a roll up POP display.

A flexible printed circuit generally identified by reference numeral 10, will now be described with reference to FIG. 1 through 28.

Structure and Relationship of Parts:

Referring to FIG. 1, there is illustrated a preferred embodiment of flexible printed circuit 10 which includes a flexible supporting substrate 12 having a first face 14 and a second face 16. Flexible printed circuit 10 is shown being used for a Point of Purchase (POP) display, generally indicated by reference numeral 100. In this preferred embodiment, flexible supporting substrate 12 is a polyester film. It will be appreciated that a plastic woven material or open pattern plastic material could be used. Conductive material 18 is positioned on first face 14, second face 16 or both first face 14 and second face 16. In this preferred embodiment, conductive material 18 is a conductive metal, preferably copper. A polyester film for supporting substrate 12 is preferred because a polyester film can be treated with an ink receptive coating for graphic printing directly onto the supporting substrate 12. Printing would generally occur on the opposite side to that receiving the copper conductive material 18. This eliminates the need of an adhesive layer to bond a separate printed graphic layer onto substrate 12.

There are various processes for placing a conductive circuit, generally indicated by reference numeral 20, of conductive material 18 on flexible supporting substrate 12. One process is by vacuum deposition of conductive material 18. The circuit material selected was a sputtered vacuum deposition of copper of a certain thickness onto a polyester supporting material of 25 micron to 250 micron. It was preferred when the polyester supporting material was in a roll format. Electrical discharge machining (also known as EDM or spark erosion) was then used to form conductive pathways defining a flexible conductive circuit 20 on conductive material 18 of copper in a controlled manner without detrimental damage to the supporting 50 um polyester layer. Although copper was used, it will be appreciated that aluminium or nickel or silver can be used as alternative conductive metals.

Regardless of which process is used, a flexible conductive circuit 20 is defined. Flexible conductive circuit 20 includes placement circuits for receiving electrical components. In early embodiments, the electrical components were light emitting diodes LED) lights 22. In later embodiments, other electrical components were added.

All the commonly practiced methods of attaching electrical components to the placement circuits on flexible conductive circuit 20 were tried, but without success. A novel solution was needed. We fabricated a butterfly shape made from Kapton with a copper etch pattern so we could solder an LED onto the copper along with an appropriate resistor. "Kapton" is a DuPont Trademark for a high temp polyimide film used for specialty flexible circuits. The component LED and resistor are situated in the narrow center of the wings of the Kapton. The wings of the Kapton, having the largest area, are attached using a conductive film adhesive.

Figure 2:
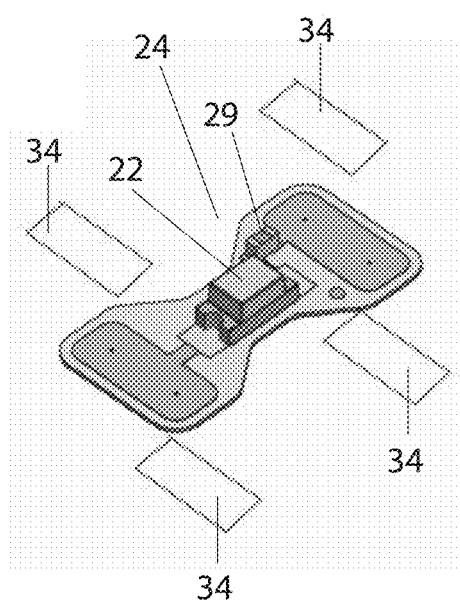
FIG. 2 is a perspective view of a butterfly interface from the POP display illustrated in FIG. 1.
Figure 6A:
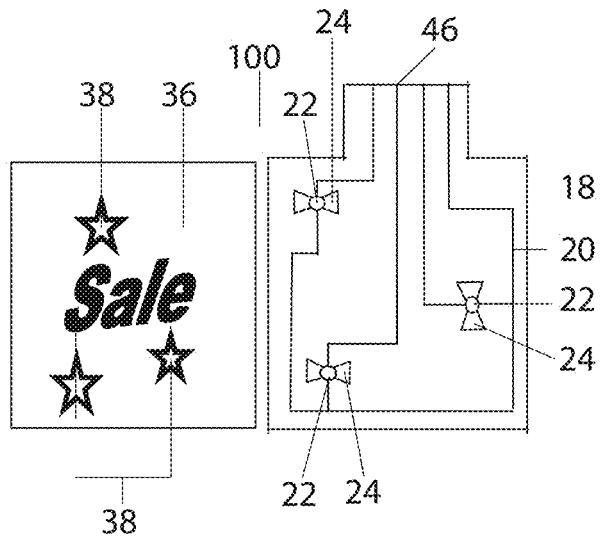
FIG. 6A is an exploded view of a one sided POP display with conductive circuit having the butterfly interface of FIG. 2 through 5.
Figure 6B:
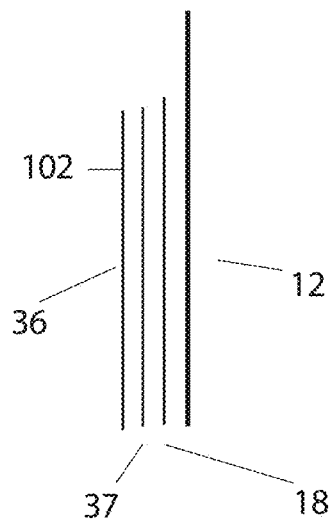
FIG. 6B is an exploded side elevation view of the one sided POP display of FIG. 6A.
Figure 6C:
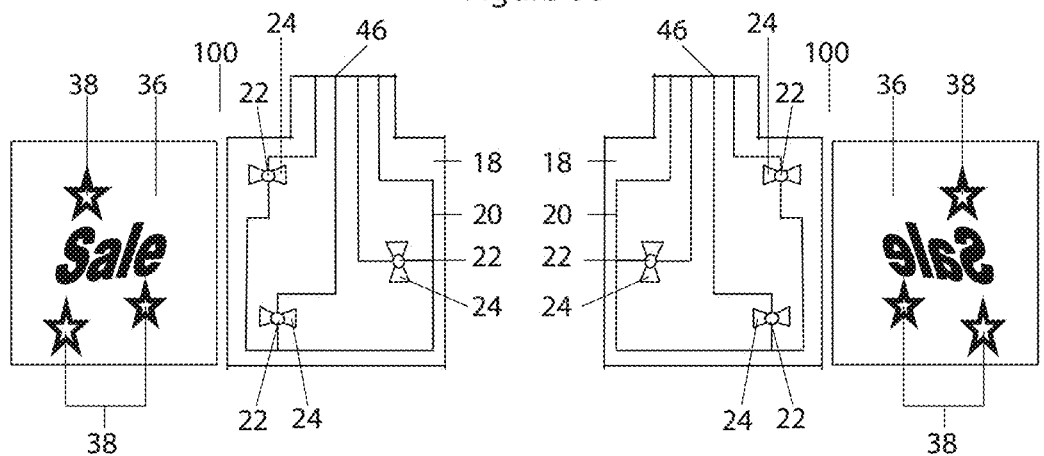
FIG. 6C is an exploded view of a two sided POP display having the butterfly interface of FIG. 2 through 5.

Referring to FIG. 1, each electrical component (LED light 22) is connected to conductive circuit 20 by a conductive butterfly connector 24. Referring to FIG. 2 through 5, conductive butterfly connector 24 has a body 26 with a central portion 27 and opposed wings 30. Body 26 of butterfly connector 24 is made from a high temp polyimide film upon which is deposited a conductive copper layer 32 which is etched with a conductive circuit. The electrical component (LED light 22) is secure to central portion 27. Wings 30 are attached to conductive circuit 20, described above, with a conductive film adhesive 34. Referring to FIG. 6A and FIG. 6C, conductive circuit 20 is illustrated with butterfly connectors 24 in place, with each butterfly connector supporting an LED light 22 (and a resistor 29 as best illustrated in FIG. 2). LED light 22 and resistor 29 are held in place by soldering, with solder pads being identified, in FIG. 3 by reference numeral 31.

Figure 6D:
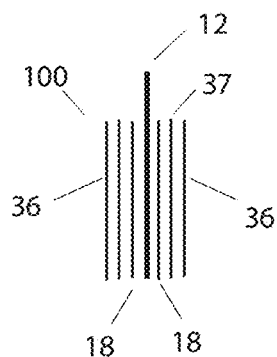
FIG. 6 D is an exploded side elevation view of the two sided POP display of FIG. 6C.

Referring to FIG. 1, when used for POP display 100, flexible supporting substrate 12 with conductive circuit 20 is provided with a graphic overlay sheet 36 to define a visual display 102. In the preferred embodiment illustrated, graphic overlay sheet 36 is flexible. There will hereinafter be described other embodiments that have graphic overlay sheets that are not flexible. In the preferred embodiment, is it preferred that graphic overlay sheet 36 be flexible so that visual display 102 can be rolled and unrolled. A housing 104 is provided for visual display 102. A stored position is provided wherein visual display 102 is retracted within housing 104 in a roll configuration. An operative position is provided, wherein visual display 102 extends from housing 104 when in a planar operative position. Visual display 102 can be rolled and unrolled at will to move between the operative position and the stored position. In the preferred embodiment, conductive circuit 20 is connected to one or more lighting components, namely LED lights 22. For that reason, graphic overlay sheet 36 has one or more windows 38. During assembly, each LED light 22 is aligned with one of windows 38, such that light from each LED light 22 is visible through graphic overlay sheet 36. Referring to FIG. 6A, there is illustrated a one side visual display 102 and Referring to FIG. 6C there is illustrated a two sided visual display 102. Each visual display 102 has a graphic overlay sheet 36 with the words "SALE" along with three stars that represent windows 38. Each of windows 38 is aligned with one of LED lights 22, so the visual effect is that of "twinkling" stars to draw a viewer attention to the SALE message on visual display 102. Referring to FIG. 6B and FIG. 6D, the layers of each POP display 100 are shown. With graphic layer 36 being attached to conductive material 18 on which conductive circuit 20 is etched by means of adhesive 37.

Various method to create a connection area on flexible circuit were investigated and tested. Using a woven commercially available conductive cloth or copper foil with a conductive adhesive backing and placing it on the end of the conductive pathway we were able to make a good and reliable flexible contact tab area.

Figure 7:
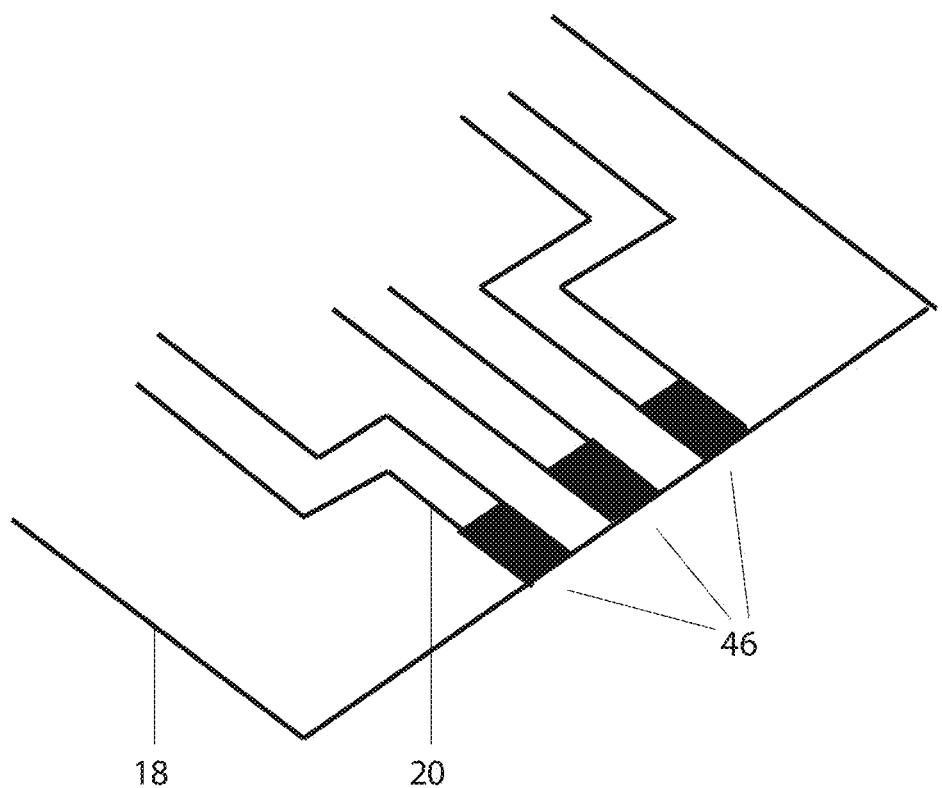
FIG. 7 is a perspective view of a circuit tab connection of the POP display of FIG. 1.
Figure 7A:
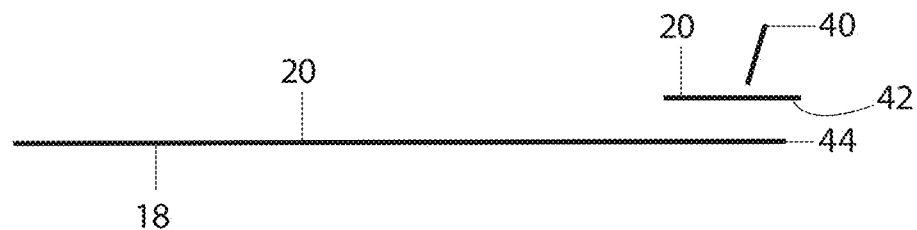
FIG. 7A is an exploded detailed side elevation view of the circuit tab connection of FIG. 7.

Referring to FIG. 1, a connection interface is provided for connecting conductive circuit 20 to a power source (not shown in this FIG). The connection interface for connecting conductive circuit 20 to a power source is a conductive cloth or metal foil 40 which is used to create flexible contact tab areas 46. Referring to FIG. 7 and FIG. 7A, conductive cloth or metal foil 40 has a conductive adhesive backing 42 secured along an edge 44 of conductive circuit 20 to create flexible contact tab areas 46. There are other configurations of connection interface that could be used, has will hereinafter be described.

Various ways of inputting outside control input signals were investigated and tested. A novel solution was required. A hinged jaw slightly longer than the width of the Large Area Circuit (LAC). One or both of the jaws would be of rubber, foam or other malleable material. On the inside of the closing jaw so that the rubber would make contact against the contacts on the circuit. Onto that rubber would have Conductive tape or conductive flat mesh applied in stipes that correspond To the pitch or spacing of the contact tabs on the (LAC). To these conductive areas on the rubber will be solder or other connections to the wire Leads from the display controller and power supply. The controller itself could be external of the connection jaws or could fit internally. Into the interior of one of the jaws with a receptacle for wall power or a battery holding area. This jaw (similar in a sense to rooftop ski racks) would clamp over the (LAC) and the end opposite the hinge would be securely closed causing pressure between the (LAC) contact area and the hinge bar power signal bar.

Referring to FIG. 1, a removable clamp 50 is used to make a connection with flexible contact tab areas 46. Referring to FIG. 13, clamp 50 has contact areas 52. Referring to FIG. 1, by closing clamp 50 over flexible tab contact areas 46, pressure from clamp 50 completes an electrical connection between flexible tab contact areas 46 and contact areas 52 of clamp 50. Referring to FIG. 13, in the preferred embodiment, clamp 50 is lined with a malleable non-conductive material 54 that supports contact areas 52. Clamp 50 is in a jaw configuration having a first end 56 and a second end 58. A hinge 60 is positioned at first end 56. Clamp 50 has a pair of arms 61 and 63. A pivoting closure arm 62 is positioned at second end 58 of arm 63. Pivoting closure arm 62 has a first end 67 that is pivotally connected to second end 58 of arm 63. Referring to FIG. 13B, pivoting closure 62 has a second end 69 with a closure member 71. Referring to FIG. 13, closure member 71 engages a notch 73 at second end of arm 63 to secure clamp 50 closed in a clamping position. A controller board 65 is fits into arm 61 and connects with contact areas 52. There are other configurations that clamp can take, as will hereinafter be described. Referring to FIG. 13A, when removable clamp 50 is to be used with a flexible circuit configuration that is two sided, there are contact areas 52 along both of arms 61 and 63.

Complex circuits have "cross-overs" where there is a crossing of conductive pathways on conductive circuit 20. It is common due to location of components and complexity of design that one conductive pathway will need to jump over another pathway. Direct crossing of pathways would, of course, cause a short. On ridge circuit boards, the jump is done by fabricating a conductive hole from one copper trace line on one side of the board to a copper trace line on the other side of the board. This is called a conductive via. Making conductive via's on a think flex material is quite hard to do, so in the industry it is accomplished by printing a dielectric insulating cover layer on top of the conductive pathway you need, to protect it from shorting. Dielectric insulating cover layers are usually printed and cover the whole area that needs to be insulated. Then the board is placed into a cover belt and then into a curing chamber, typically UV or heat.

The use of a dielectric insulating cover layer was simply too cumbersome for a large thin flexible material. A novel approach had to be developed. Instead of trying to print over the whole area, the approach adopted was to spot print just the area needed. In this regard, a small print head travels over the work area, using a CNC. There is a dispensing or other print head technology and a small spot curing element, which follows behind. This method is able to quickly and cost effectively cover a large area with subsequent Dielectric and conductive layers onto a first patterned layer.

Figure 20:
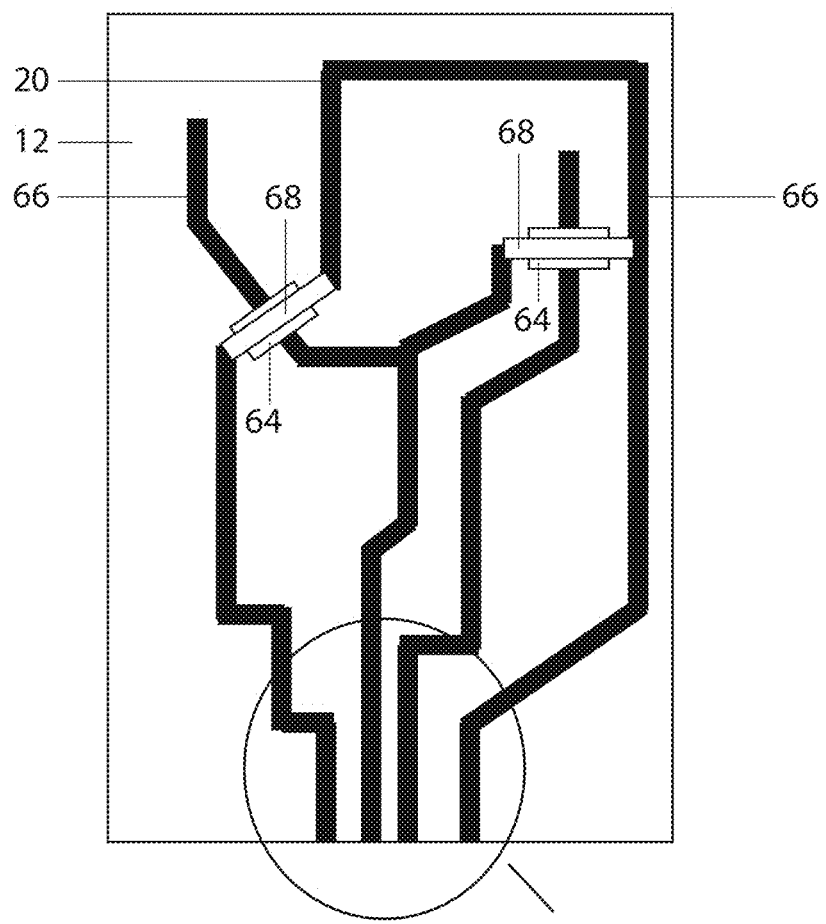
FIG. 20 is a top plan view of a multi-layer circuit having cross-overs.
Figures 20A, 20B:
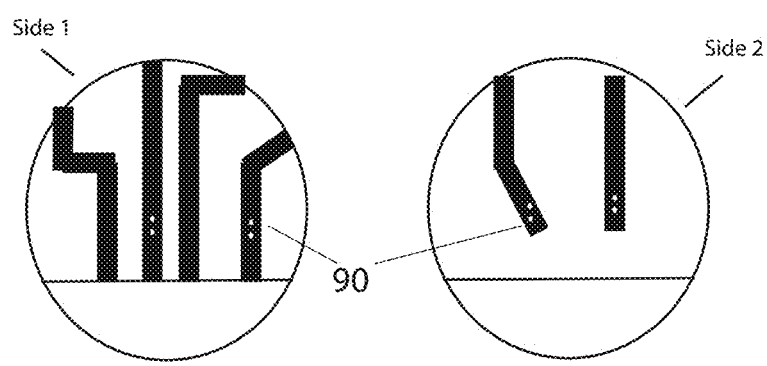
FIG. 20A is a detailed top plan view of the multi-layer circuit of FIG. 20, showing conductive vias connecting a first side and a second side from the first side.
FIG. 20B is a detailed bottom plan view of the multi-layer circuit of FIG. 20, showing conductive vias connecting the first side and the second side from the second side.

Referring to FIG. 20, accommodation of cross-overs was accomplished by spot positioning a bridge 64 of a dielectric insulating layer over one of conductive pathways 66 of conductive circuit 20. This creates a path for conductive cross-over 68 to cross conductive pathway 66 via bridge 64. Referring to FIG. 20A and FIG. 20B, there are conductive vias 90 connecting a first side with a second side.

A particular feature of flexible printed circuit 10 which must be emphasized is the ability to create a conductive circuit of virtually any size. The functional limit of most flexible printed circuit boards is a size of 14 inches by 16 inches. By following the teachings set forth herein one can make a conductive circuit in excess of that size.

It is often required to start with a two sided copper substrate. That is copper on side of the board and copper on the other side of the board. In rigid circuit boards and flexible circuits these two separate sides are connected by drilled hole through a middle insulating layer and then the bare hole is plated in a plating bath to give conductivity from one plane to the other.

Figure 3:
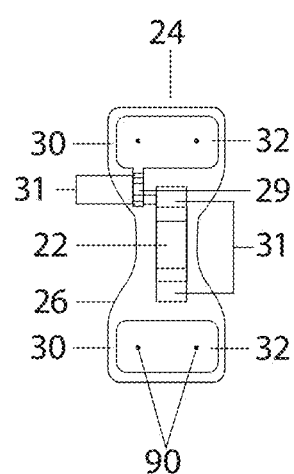
FIG. 3 is a top plan view of the butterfly interface illustrated in FIG. 2.
Figure 4:
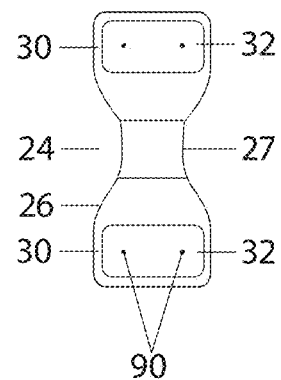
FIG. 4 is a bottom plan view of the butterfly interface illustrated in FIG. 2.
Figure 5:
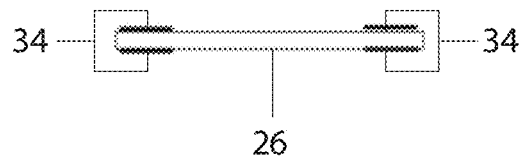
FIG. 5 is a side elevation view of the butterfly interface illustrated in FIG. 2.

We could not plate through the holes as the size is a restriction as well as the thin material has no physical support strength and it would be difficult to submerse in a bath. A novel approach had to be developed. Micro holes were formed using either a punch or a laser, using a small traveling head on the CNC and moving into position. We would then print with a very low viscosity conductive that would penetrate through the micro holes and make contact from one conductive side to the other conductive side. This enabled us to place a first conductive circuit 20 on first face 14, a second conductive circuit 20 on second face 16 and electrically join the first conductive circuit and the second conductive circuit. Referring to FIG. 2 through FIG. 4, examples of these conductive through vias 90 are illustrated. Referring to FIG. 20, FIG. 20A and FIG. 20B, further conductive vias 90 are illustrated connecting a first side with a second side.

Advantages:

By following the teachings of the present invention, one creates a flexible conductive circuit mounted on a flexible supporting substrate. This opens all sorts of possible applications, some of which have been describe above for purposes of illustration.

A conductive copper layer on a polyester support material provides a low cost conductive material with low enough resistance so that LED's and other low power devices can be operated. The material is thin light weight and flexible. We are able to form patterns with copper on the polyester material in a way to create conductive pathways. One is able to create electrical pathways without using any resist masking, etching solution, etching or plating bathes. The conductive sputtered copper layer can be bonded to the polyester support material. The material is capable of being processed in a roll to roll manufacturing process.

The method of creating electrical pathways described is fast enough to be adequate as a production solution. The method does not damage the polyester support material. The method is an environmentally sound process. The process is simple, there is no use of film art work, etching, resist masking, developers, copper etching or plating. The method is an economical process going from a digital file to a circuit in one step.

The Butterfly connector was successful. It was affordable, easy to apply and would withstand numerous roll and un-roll cycles. As well, it could be run through a laminator without damage to LED's.

The woven commercially available conductive cloth or copper foil with a conductive adhesive backing makes a good and reliable flexible contact tab area. It enables one to connect to an outside controller through wire or some type of reliable plug and un-plug configuration. It is a connection that a person without technical training can manage. It is robust enough to withstand multiple plug and un-plugs.

Various ways of inputting outside control input signals were investigated and tested. A novel solution was required. The clamping jaw is able to connect or plug and un-plug numerous times. The connection with the clamping jaw is able to be performed by someone with no technical background. The clamping jaw is able to connect and unconnected without ripping tearing or otherwise not damage the circuit material.

Method of Manufacture

Figure 28:
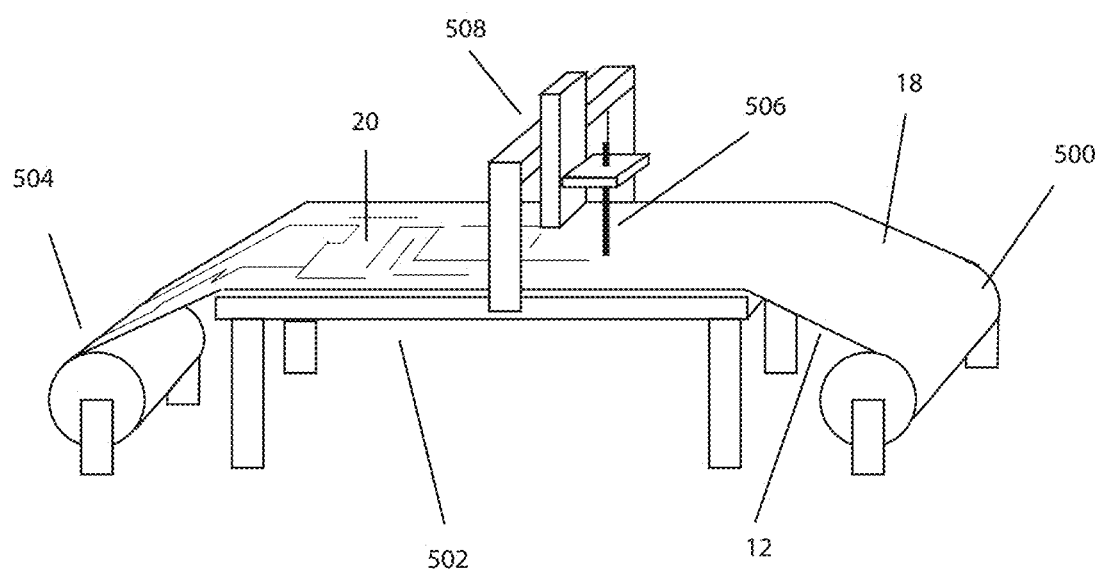
FIG. 28 is a perspective view illustrating the method used to produce the flexible printed circuit.

Referring to FIG. 28, the method of manufacture of flexible printed circuit 10 is illustrated. The method starts with depositing a flexible conductive material 18 (for example conductive metal, such as copper) through vacuum deposition onto flexible supporting substrate 12 (for example for banner and signage applications a polyester film is preferred). In this manner a feed roll 500 is created that has flexible supporting substrate with flexible conductive material 18. This feed roll 500 does not, as yet, have conductive pathways. Flexible supporting substrate 12 with flexible conductive material 18 is fed across a work table 502 to a take up roll 504. Mounted above work table 502 is an electrical discharge machining tip 506, the positioning of which is controlled by a computer controlled CNC positioner 508. As flexible supporting substrate 12 with flexible conductive material 18 passes across work table 502, flexible conductive circuit 20 is formed on flexible conductive material 18 by electrical discharge machining tip 506. Flexible conductive circuit 20 defines a plurality of electrical component placement circuits to which electrical components may be attached.

When flexible conductive circuits 20 are intended for banners or signage, it is preferred that the polyester film forming flexible supportive substrate 12 has graphic printing on the face opposite flexible conductive circuit 20.

At the end of processing, take up roll 504 will contain a length of many meters of flexible printed circuit 10. Flexible printed circuit 10 can then be cut to a desired size and a connection interface added along at least one edge to suit an intended application, as described herein with respect to the various intended applications.

Figure 10:
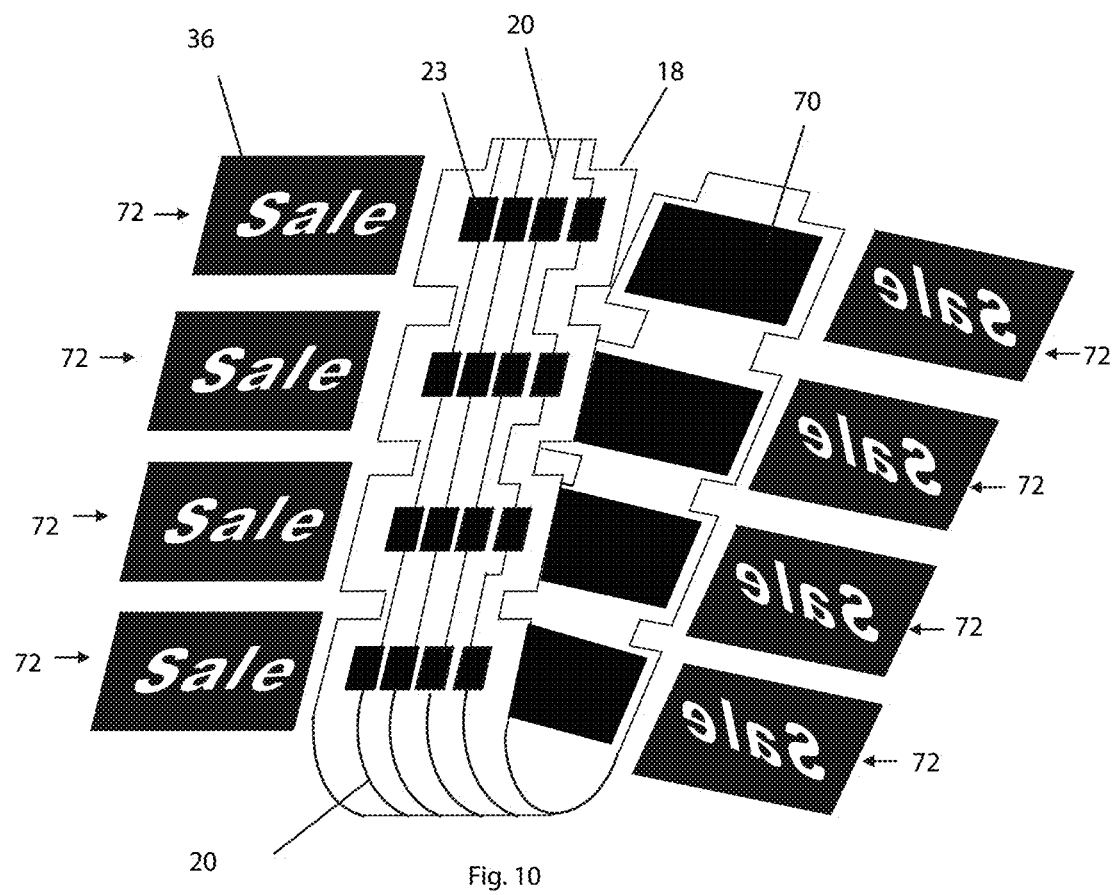
FIG. 10 is an exploded view of a foldable POP display.
Figures 11, 12:
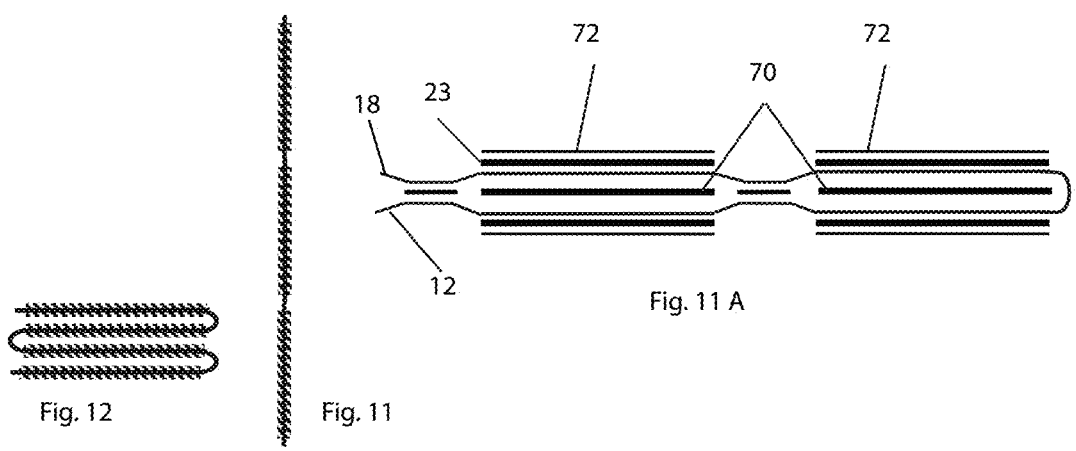
FIG. 11 is a side elevation view of the foldable POP display of FIG. 10, in an operative position.
FIG. 12 is a side elevation view of the foldable POP display of FIG. 10, in a folded position.

Variations:

Referring to FIG. 10 through FIG. 12, flexible supporting substrate 12 can be folded instead of rolled. Referring to FIG. 11, there is illustrated visual display 102 in a planar operative position. Referring to FIG. 12, there is illustrated visual display 102 folded into a stored position. Referring to FIG. 11A, there is illustrated a section view of the component elements. Visual display 102 can be folded and unfolded at will to move between the operative position and the stored position. In order to fold, graphic overlay sheets 36 need not be flexible. It is possible to use graphic overlay sheets 36 that are rigid, as long as graphic overlay sheet 36 is segmented to facilitate folding. Stiffener plates 70 can be attached by adhesive to flexible supporting substrate support substrate 12, with one stiffener plate 70 corresponding to each graphic overlay segment 72.

It must be emphasized that any electrical component may be connected to conductive circuit 20. In the preferred embodiment, LED lights 22 where attached using butterfly connector 24.

Figure 8:
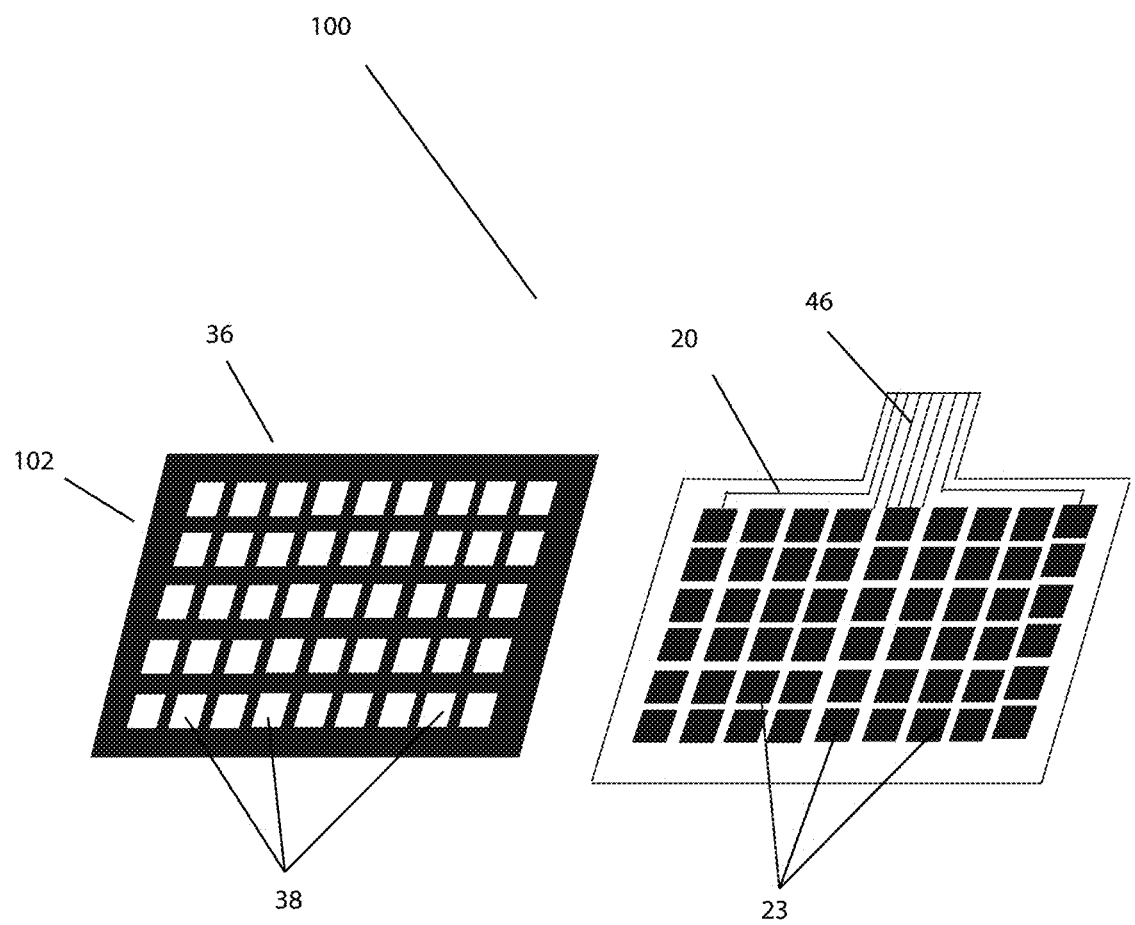
FIG. 8 is an exploded view of an electrophoretic POP display, having the circuit tab connection illustrated in FIG. 7.
Figure 9:
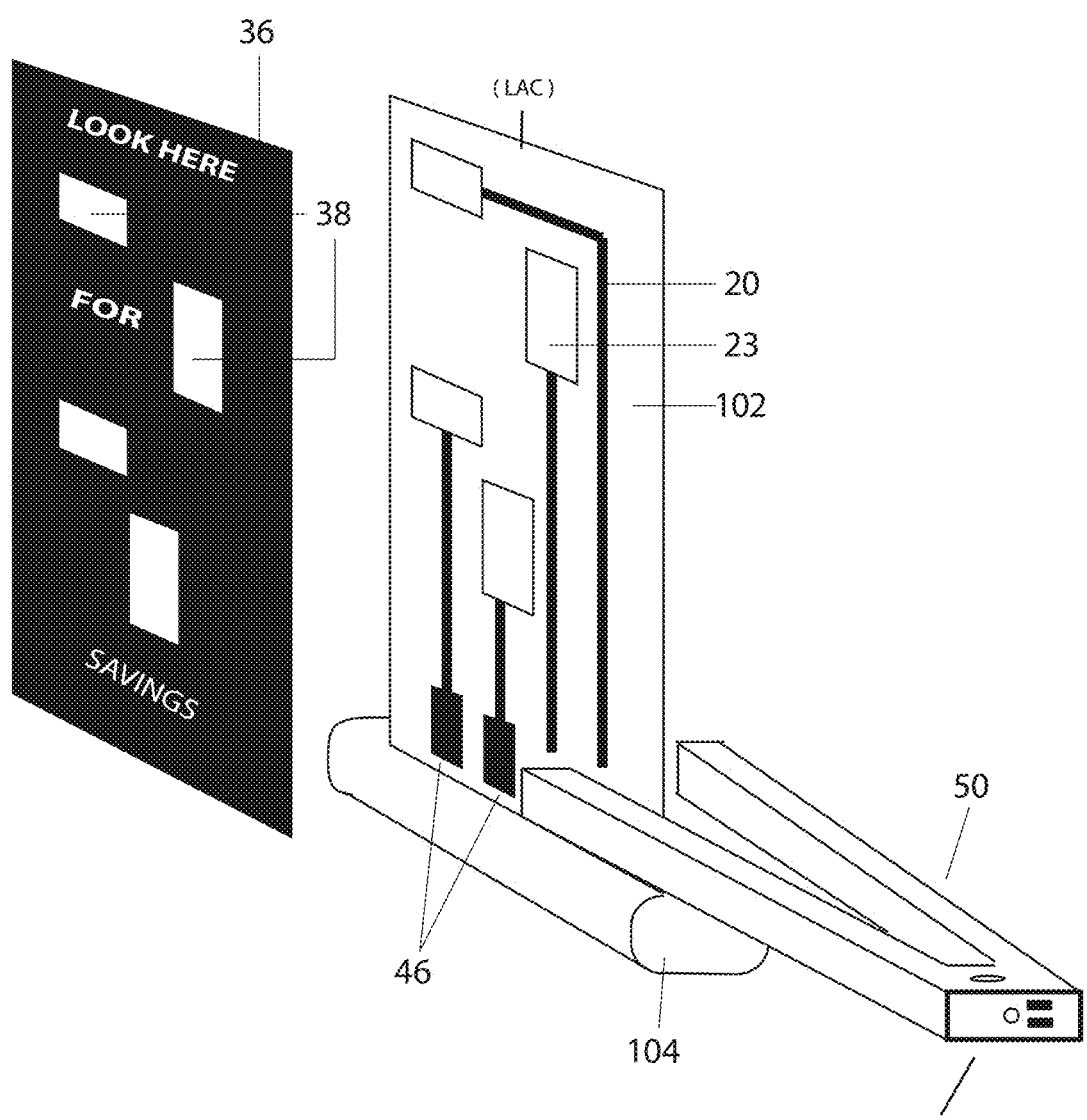
FIG. 9 is an exploded view of an electrophoretic POP display.

Referring to FIG. 8 and FIG. 9, the electrical components are electrophoretic displays 23, sold under the Trademark "Epaper". These electrophoretic displays can either be connected with butterfly connectors 24 or with conductive adhesive.

Figure 14:
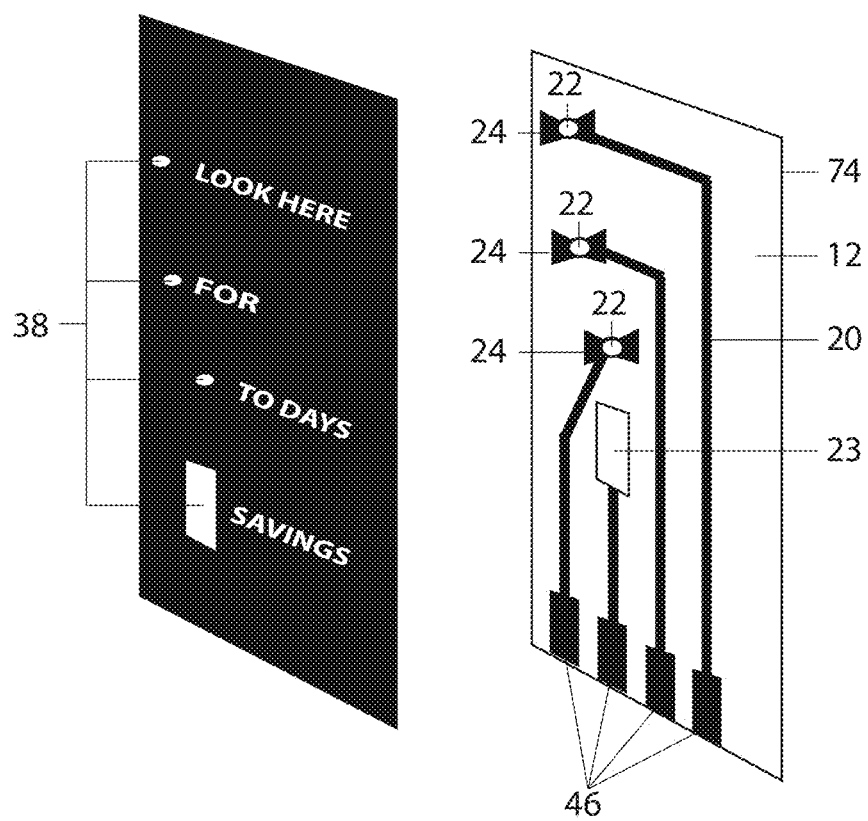
FIG. 14 is an exploded perspective view of a rigid POP display.
Figure 14:
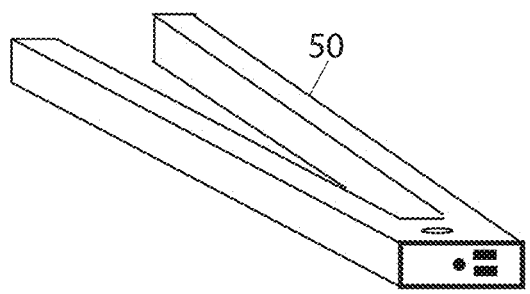

Referring to FIG. 14, graphic overlay sheet 36 may be made from rigid cardboard or some other rigid material. Flexible supporting substrate 12 with conductive circuit 20 may also be made rigid by mounting to rigid cardboard 74 or some rigid supporting material. This embodiment would still provide a cost benefit and the ability to produce larger sizes. However, it will be appreciated that the ability of folding or rolling visual display 102 into the stored position would be lost.

Another solution for creating a connection area on the flexible circuit is the use of a metal grommet connector that is crimped or stacked through or onto the conductive material, as will hereinafter be further described.

Figure 18:
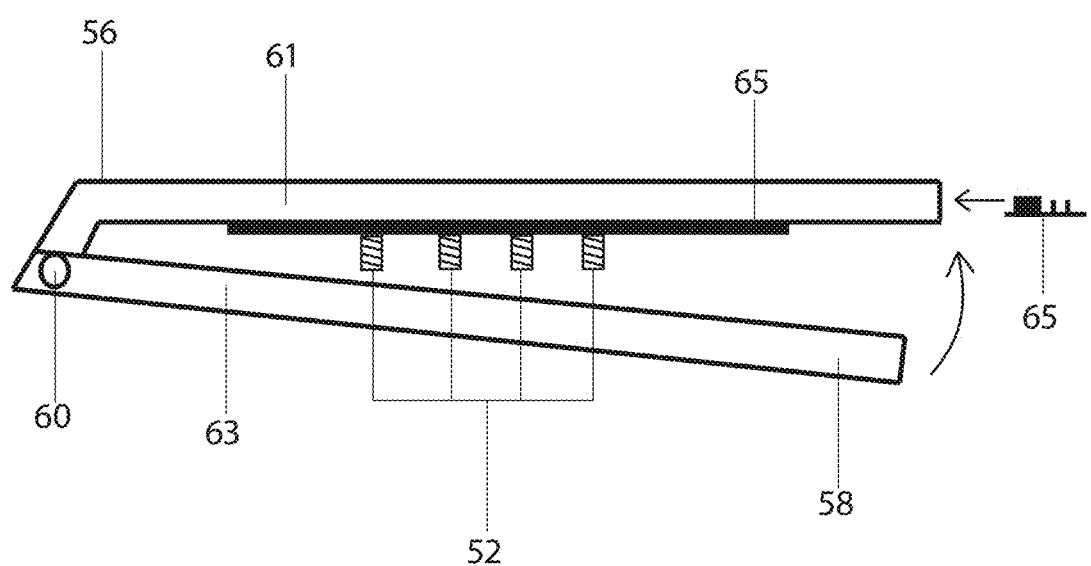
FIG. 18 is a side elevation view of an alternative configuration of connector bar.

Referring to FIG. 18, in experimenting with different jaw configurations for clamp 50. Instead of using a malleable non-conductive material 54 to supports contact areas 52, spring contacts 52 were considered to be a viable alternative. It is important that spring contacts 52 be engaged with the conductive circuit only once conductive circuit is in the operative position. If spring contacts 52 are in constant engagement they would scratch and mark the conductive circuit or the graphic overlay as it moved from the stored position to the operative position.

Figure 19:
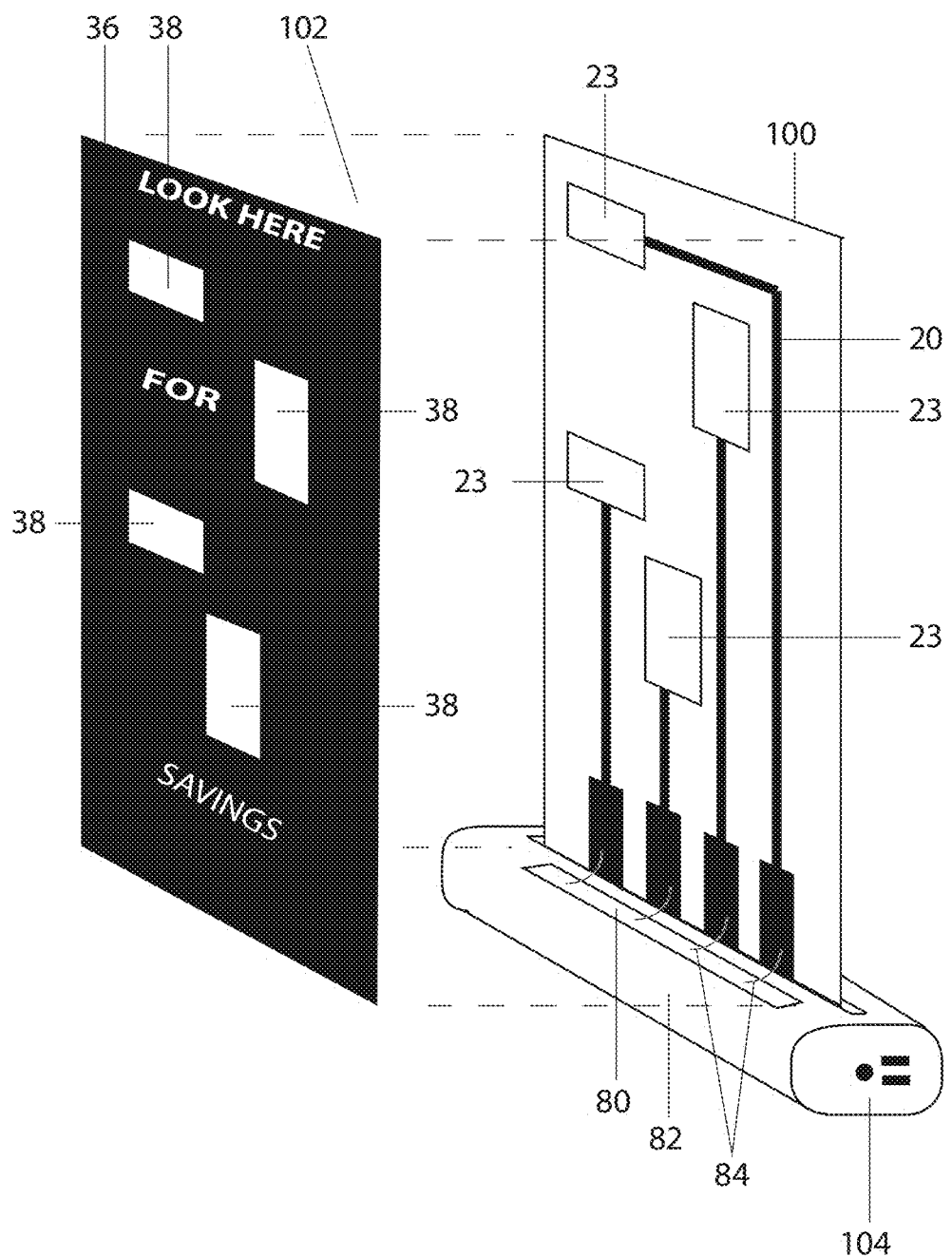
FIG. 19 is an exploded perspective view of a POP display with an alternative configuration to a connector bar.

Referring to FIG. 19, there is illustrated an alternative to clamp 50. In this embodiment, a circuit board 80 is mounted to an exterior surface 82 of housing 104. Circuit board 80 has spring contact tabs 84 which connect circuit board 80 to flexible tab contact areas 46 on conductive circuit 20 when flexible supporting substrate 12 is extended from housing 104 to the planar operative position.

Figure 15:
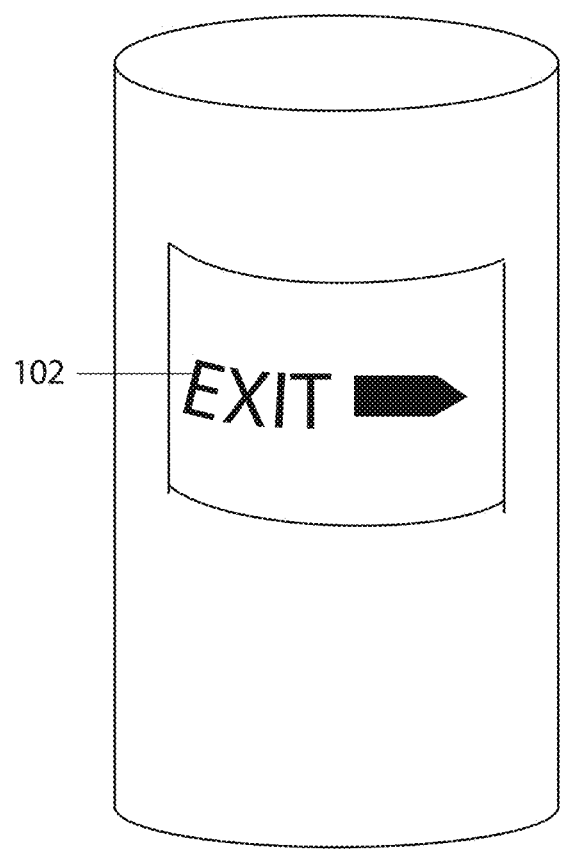
FIG. 15 is a wall sign.
Figure 16:
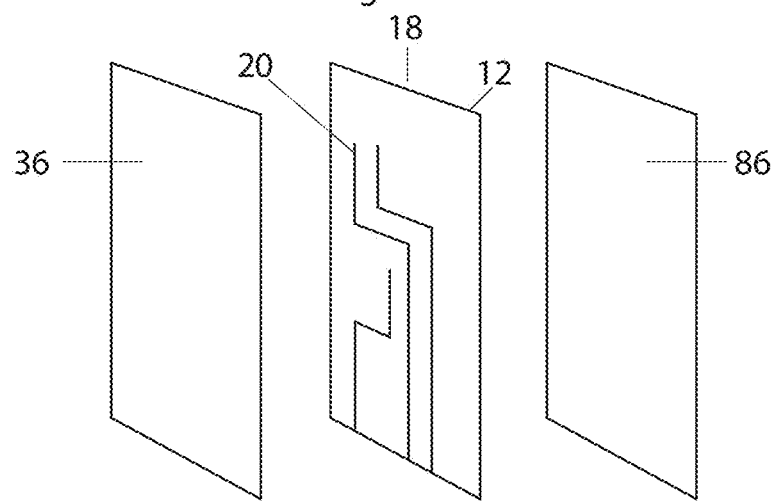
FIG. 16 is an exploded perspective view of the wall sign of FIG. 15.

Referring to FIG. 15 and FIG. 16, there is illustrated how by the addition of a two sided adhesive layer 86 to second face 16 allows visual display 102 to be mounted as a sign or banner.

Figure 17:
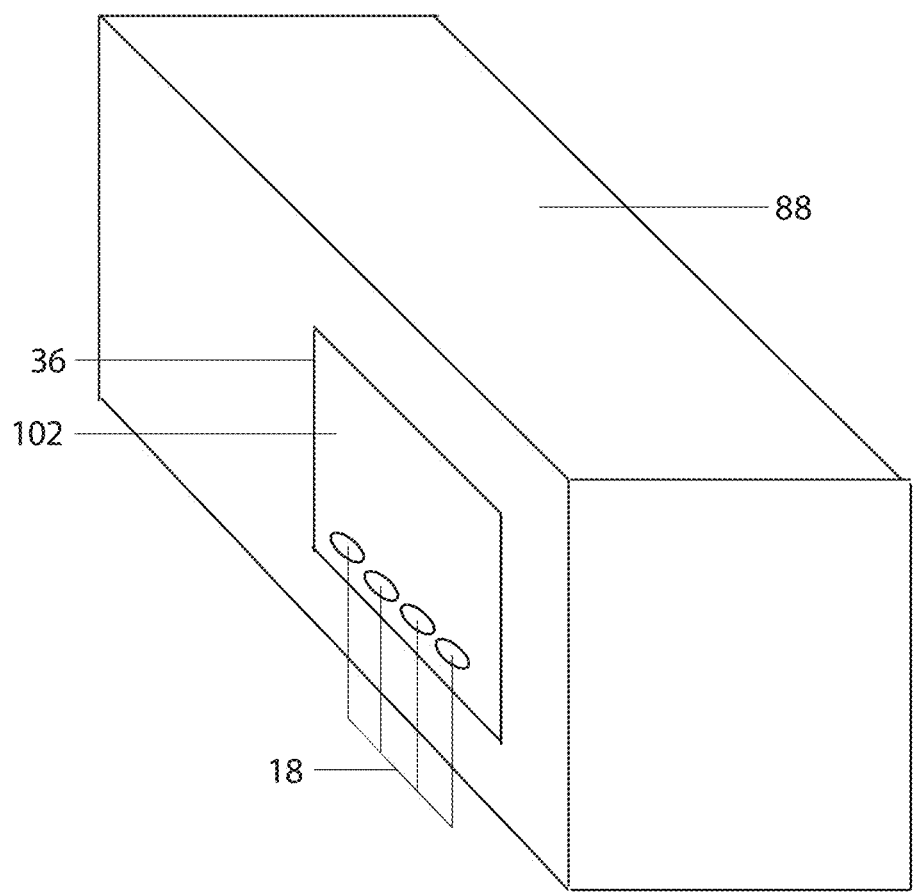
FIG. 17 is a perspective view of a truck signage.

Referring to FIG. 17, there is illustrated how the same structure illustrated in FIG. 15 can be used as a decal for a vehicle, such as trailer 88. Devices are commercially available that produce energy from vibrations. Such a device can use vibrations generated as the vehicle travels down the road to power the conductive circuit to light the LED lights.

Another solution for inputting outside control input signals would be to mount all control components onto a placement circuit and surface mount the controller directly onto the circuit, thus eliminating the need for separate controller signal and power connector.

Figure 21:
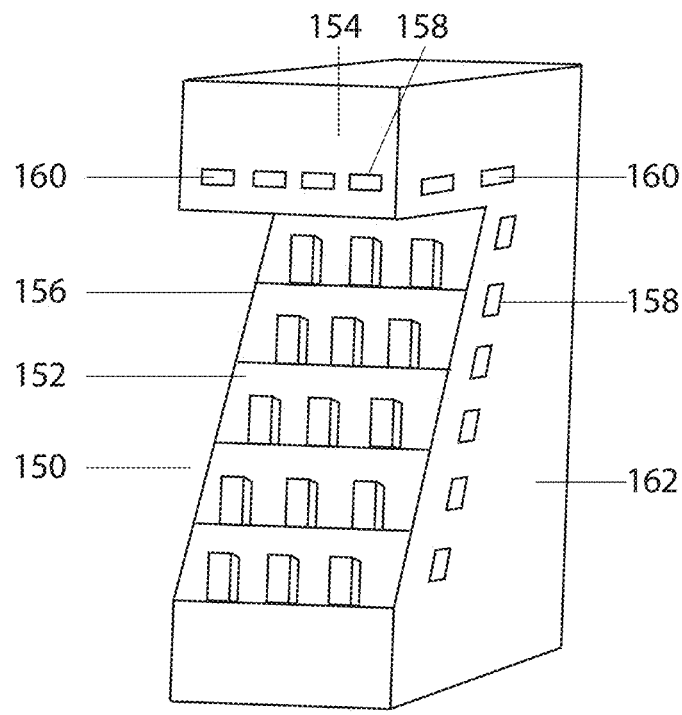
FIG. 21 is a perspective view of a Three Dimensional Display Stand.
Figure 22:
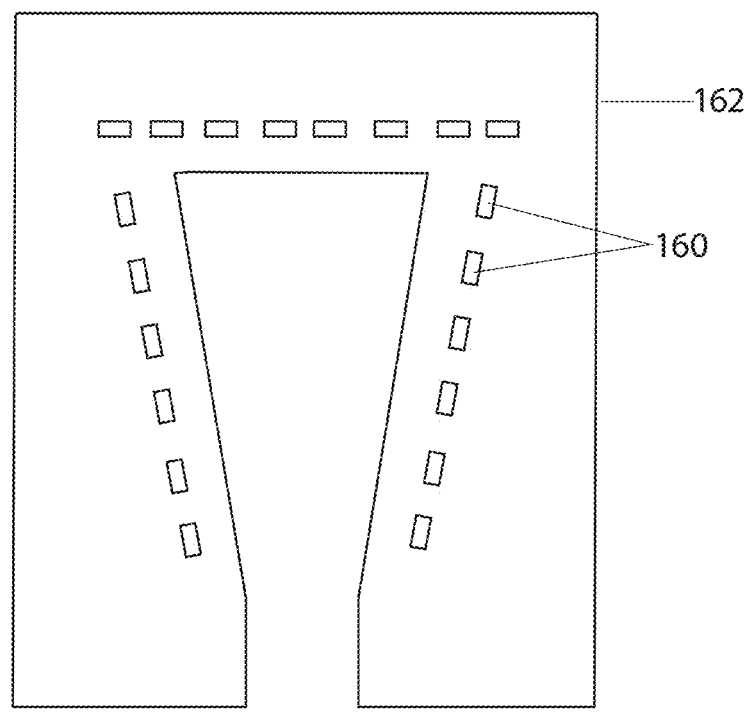
FIG. 22 is a top plan view of a flexible printed circuit developed for use with the Three Dimensional Display Stand illustrated in FIG. 21, shown cut out ready for installation.

Referring to FIG. 21 there is illustrated three dimensional display stand, generally identified by reference numeral 150. Display stand 150 has an angled front display space 152, a front header 154 and sides 156. There are windows 158 across front header 154 and down sides 156 through which electrophoretic displays 160 are visible. Referring to FIG. 22, there is illustrated a flexible printed circuit 162 developed for use with three dimensional display stand 150. Flexible printed circuit 162 supports electrophoretic displays 160. Flexible printed circuit 162 is fabricated as described above in relation to flexible printed circuit 10 and then all superfluous material is cut out. Flexible printed circuit 162 is then folded to conform to the shape of display stand 150, so that electrophoretic displays 160 are visible through windows 158 that are positioned across front header 154 and down sides 156.

Figure 23:
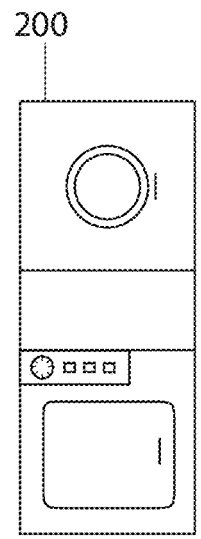
FIG. 23, labelled as PRIOR ART, is a front elevation view of a combination washer and dryer.
Figure 23A:
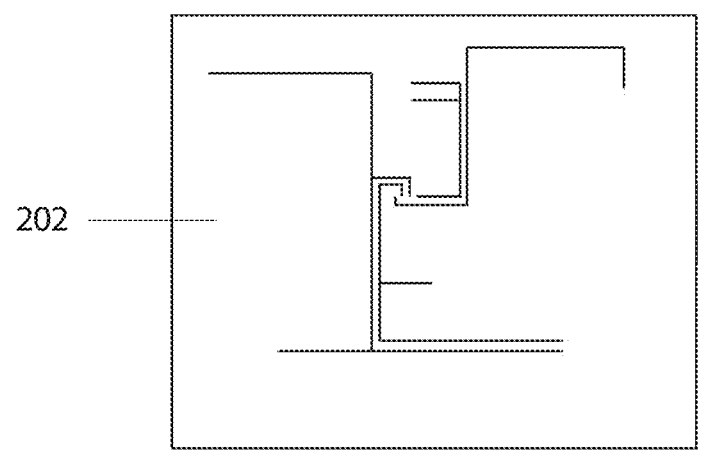
FIG. 23A is a top plan view of a flexible printed circuit developed for use with the combination washer and dryer illustrated in FIG. 23
Figure 24:
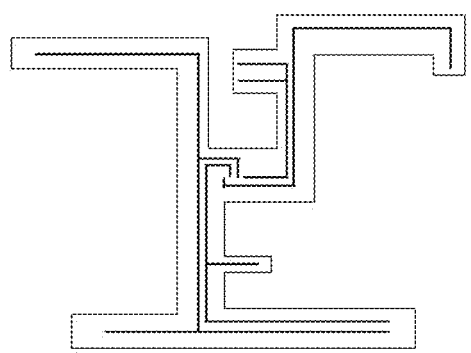
FIG. 24 is a top plan view of the flexible printed circuit developed for use with the combination washer and dryer illustrated in FIG. 23A, shown cut out ready for installation.
Figure 25:
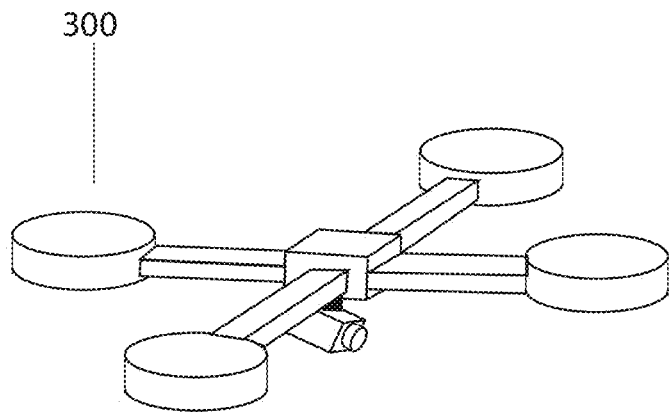
FIG. 25, labelled as PRIOR ART, is a perspective view of a drone.
Figure 25A:
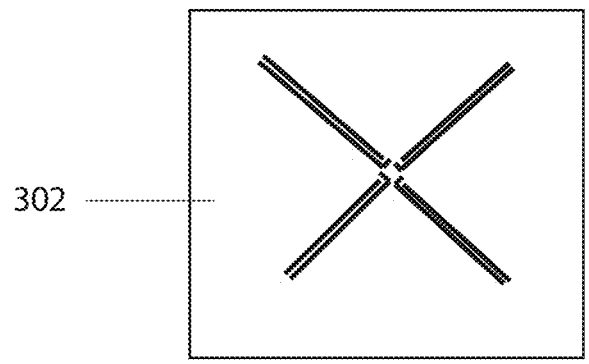
FIG. 25A is a top plan view of a flexible printed circuit developed for use with the drone illustrated in FIG. 25.
Figure 26:
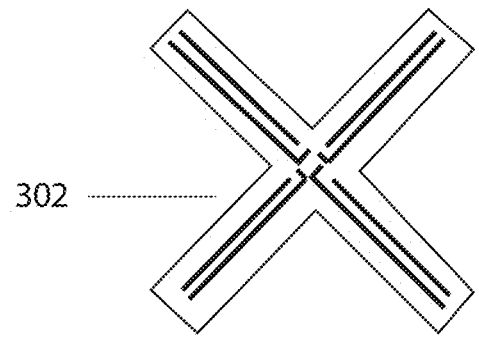
FIG. 26 is a top plan view of the flexible printed circuit developed for use with the drone illustrated in FIG. 25A, shown cut out ready for installation.

As stated above, it is now realized that this flexible printed circuit has application beyond point of purchase display. Referring to FIG. 23, there is illustrated a PRIOR ART combination washer and dryer, generally indicated by reference numeral 200. Referring to FIG. 23A and FIG. 24 there is illustrated a version of flexible printed circuit 202 developed expressly for use with combination washer and dryer 200 in order to replace the wire harness. Flexible printed circuit 202 is fabricated as described above in relation to flexible printed circuit 10 and then all superfluous material is cut out to allow flexible printed circuit 202 to fit the space formerly occupied by the wire harness. Referring to FIG. 25, there is illustrated PRIOR ART drone, generally indicated by reference numeral 300. Referring to FIG. 25A and FIG. 26, there is illustrated a version of flexible printed circuit 302 developed expressly for use with drone 300 in order to replace the wire harness. Flexible printed circuit 302 is fabricated as described above in relation to flexible printed circuit 10 and then all superfluous material is cut out to allow flexible printed circuit 302 to fit the space formerly occupied by the wire harness.

Figure 27:
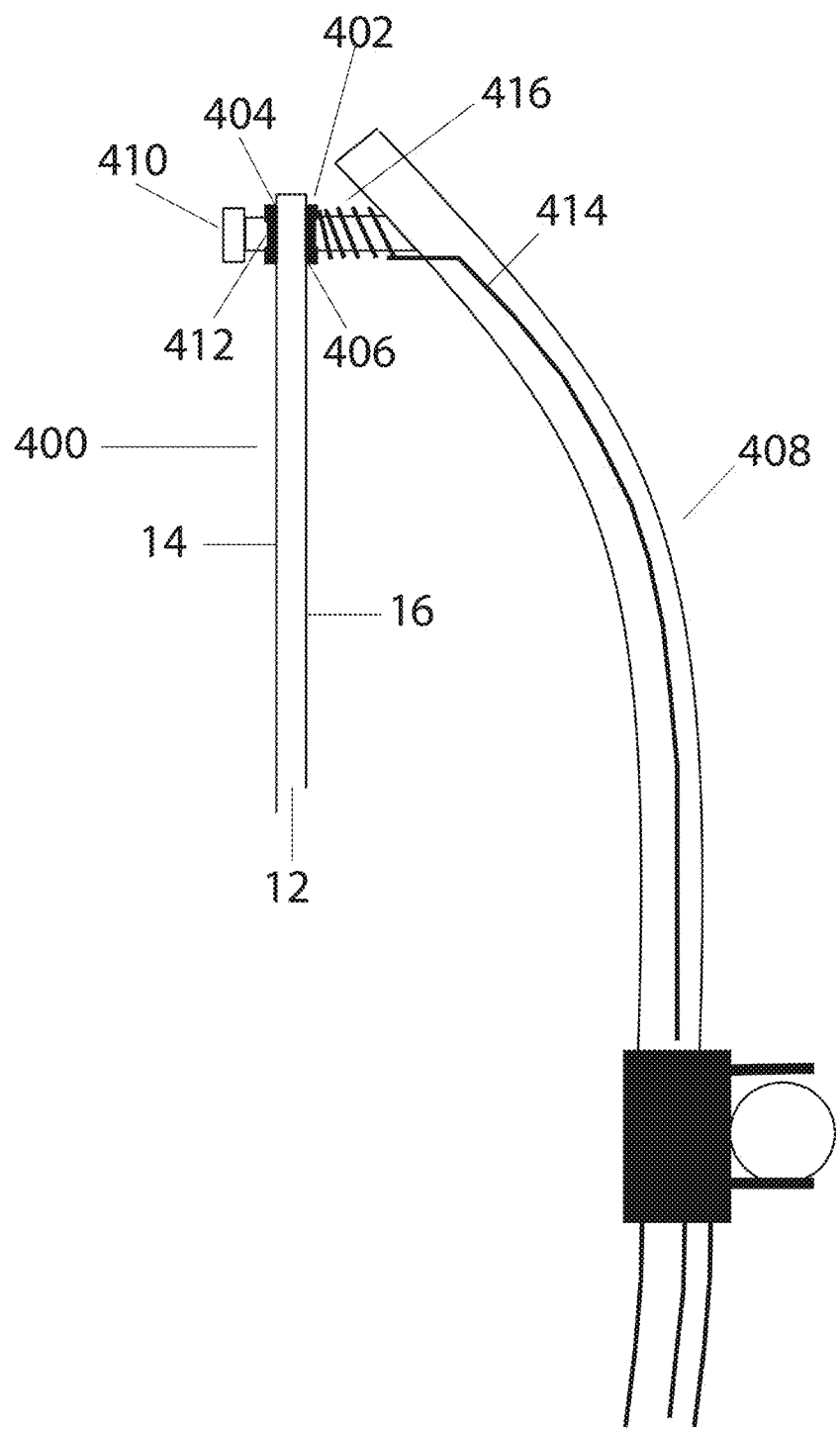
FIG. 27 is a side elevation view of a grommet mounting for banner made from the flexible printed circuit.

Referring to FIG. 27, an effort has been made to simply both the manner of mounting flexible supporting substrate 12 and the connection interface for connecting the flexible conductive circuit (not shown in this view) to a power source (not shown in this view). In this embodiment, flexible supporting substrate 12 is shown as being a banner, generally indicated by reference numeral 400. A grommet 402 is secured to flexible support substrate 12, with a first portion 404 of grommet 402 engaging first face 14 and a second portion 406 of grommet 402 engaging second face 16. Grommet 402 is intentionally positioned on flexible supporting substrate 12 so that it engages the flexible conductive circuit. A support stand 408 is provided for supporting banner 400. Support stand 408 has banner attachment arms 410. Banner attachment arms 410 are generally made from a non-conductive material. Banner 400 is mounted to support stand 408 by having attachment arms 410 inserted into a central opening 412 of grommet 402. An electrical connection is then made by coupling a conductive wire 414 extending from a power source (not shown) to grommet 402 in order to provide power to the flexible conductive circuit. It is preferred that conductive wire 414 run through the support stand. A preferred way of making that coupling is by means of a conductive compression spring 416. Connection is made very rapidly by merely raising banner 400, inserting attachments arms 410 into a central opening 412 of grommet and allowing the conductive compression spring 416 to engage grommet 402. The number of attachment arms 410 and the number of grommets 402 and the number of conductive compression springs 416 will depend upon the shape and size of banner 400.

Cautionary Warnings:

The properties of flexible conductive circuit required for an application will vary depending upon how tight a radius one may wish to roll the flexible supporting substrate without causing damage to the flexible conductive circuit. Also of concern is how frequently the flexible supporting substrate may be rolled and unrolled, before there is a danger of material fatigue of the conductive material adversely affecting the operation of portions of the flexible conductive circuit.

There will now be described various methods that were used in the formation of the flexible printed circuit mounted on a flexible supporting substrate and why some of them failed or were not preferred.

Various materials were investigated and tested. Carbon coated polyester or paper was too expensive, production rolls were not wide enough and electrical resistance was too high. Screen Printed silver conductive paste onto polyester was too expensive and required a screen or masking step as well as curing step. With flexo-printed conductive silver paste onto polyester, resistance of conductive trace was too high, the rolls were not large enough and a curing step was needed. Ink jet printed conductive material was too expensive and very few conductive jet-able inks are commercially available. In addition, a curing step was need and the cost of equipment was prohibitive. Another process is bonding a flexible foil of conductive material to flexible supporting substrate.

Although electrical discharge machining is the preferred manner of forming conductive pathways of flexible conductive circuit on the conductive material, one must take care to keep the sparking electrode clean. Should the sparking electrode become contaminated with burn-off, it will started to produce uneven lines and open breaks in the conductive pathways.

Various alternative methods of creating electrical pathways were investigated and tested. Ultrasonic ablation did not work, as it was slow and problematic. Laser ablation crated too much heat and would burn through the supporting layer. CNC Micro sandblasting was hard to control, produced uneven lines and left particulate matter that would need to be washed off. Mask sandblasting required 2 masks, one for X direction and one for the Y direction. It also would leave particulate needing to be washed off. Another etching a flexible foil of conductive material after bonding to flexible supporting substrate. Other circuit material could be a copper foil laminated onto the polyester support material or a CNC syringe dispensed conductive material onto the polyester support material. One solution is subtractive of copper on Polyester and the other solution is a syringe deposition as an additive.

Various methods of attaching LED's and other ridge components were investigated and tested. Direct soldering even under very controlled conditions was not successful due to heat damage to the material. Ultrasonic and laser were not practical and the cost of a large area machine was prohibitive. Conductive epoxy is well known attachment method in the membrane switch fabrication. It did work to a limited extent but was prohibitive slow and fragile. It also required a secondary clear dome urethane protection layer as added structural support. It was particularly prone to failure during roll up testing. Direct attachment using film conductive adhesives was not practical as the footprint or attachment area of the LED's is too small to allow good bonding. It was also prone to failure during Roll up testing.

Various method of creating a connection area on the flexible circuit were investigated and tested. Direct soldering even under very controlled conditions was not successful as heat damage to the material. Conductive epoxy did not work as the epoxy was brittle and puller away from the flexible circuit during roll up testing.

Various ways of inputting outside control input signals and power were investigated and tested. Conventional connectors would not work because pitch or spacing of contact tabs is not conventional spacing due to limitations of material, electrical resistance and physical properties of the support material. Wires soldered to individual push clips had to be attached one at a time. This was very time consuming with a possibility of mismatching connections. A ridge circuit board with wires soldered to etched contact tabs was not reliable as one could not make consistent contact and needed some external clamping device to hold together.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

The scope of the claims should not be limited by the illustrated embodiments set forth as examples, but should be given the broadest interpretation consistent with a purposive construction of the claims in view of the description as a whole.

What is claimed is:

1. A flexible printed circuit comprising:
   a flexible supporting substrate having a first face and a second face; and
   a flexible conductive material deposited by vacuum deposition on at least one of the first face or the second face of the flexible supporting substrate, a flexible conductive circuit formed from the flexible conductive material by electrical discharge machining, and the flexible conductive circuit defining a plurality of electrical component placement circuits to which electrical components may be attached;
   a graphic overlay applied to the flexible conductive circuit, and the graphic overlay having windows; and
   light emitting devices or light reflecting devices connected to the flexible conductive circuit, and each light emitting device or light reflecting device being aligned with one of the windows such that light from each light emitting device or light reflecting device is visible through one of the windows of the graphic overlay.

2. The flexible printed circuit of claim 1, wherein a connection interface is coupled with the flexible conductive circuit to receive power input.

3. The flexible printed circuit of claim 2, wherein control input signals are received through the connection interface.

4. The flexible printed circuit of claim 2, wherein the connection interface for connecting the flexible conductive circuit to a power source is one of a conductive cloth or a metal foil secured along an edge of the flexible conductive circuit to create a flexible contact tab area.

5. The flexible printed circuit of claim 4, wherein connection to the connection interface is made by a removable clamp, and the clamp has contact areas such that, by closing the clamp over the connection interface, pressure from the clamp completes an electrical connection between the connection interface and the contact areas of the clamp.

6. The flexible printed circuit of claim 2, wherein the connection interface for connecting the flexible conductive circuit to a power source is one or more grommets, a first portion of each grommet engaging the first face of the flexible supporting substrate and a second portion of each grommet engaging a second face of the flexible supporting substrate, and each grommet engaging the flexible conductive circuit.

7. The flexible printed circuit of claim 6, wherein the grommets are used to mount the flexible conductive circuit, and the mounts have electrical contacts integrated to provide power to the flexible conductive circuit.

8. The flexible printed circuit of claim 1, wherein control input signals are received through the placement circuits.

9. The flexible printed circuit of claim 1, wherein the flexible supporting substrate with flexible conductive circuit has a planar operative position and has a stored position in a roll configuration, such that the flexible supporting substrate with flexible conductive circuit can be rolled and unrolled at will to move between the operative position and the stored position.

10. The flexible printed circuit of claim 1, wherein the flexible supporting substrate with flexible conductive circuit has a planar operative position and has a stored position in a folded configuration, such that such that the flexible supporting substrate with flexible conductive circuit can be folded and unfolded at will to move between the operative position and the stored position.

11. The flexible printed circuit of claim 1, wherein the conductive material is a conductive metal.

12. The flexible printed circuit of claim 11, wherein the conductive metal is one of copper, aluminum, nickel or silver.

13. The flexible printed circuit of claim 1, wherein the electrical components are light emitting devices.

14. The flexible printed circuit of claim 13, wherein the light emitting devices are light emitting diodes (LED).

15. The flexible printed circuit of claim 1, wherein the electrical components include integrated controllers.

16. The flexible printed circuit of claim 1, wherein the electrical components include a plurality of discrete electrophoretic displays.

17. The flexible printed circuit of claim 1, wherein the graphic overlay sheet is flexible.

18. The flexible printed circuit of claim 17, wherein the flexible supporting substrate with flexible conductive circuit having the flexible graphic overlay sheet is retracted within a housing in a roll configuration when in a stored position and extends from the housing when in a planar operative position.

19. The flexible printed circuit of claim 1, wherein each electrical component is connected to one of the plurality of placement circuits of the flexible conductive circuit by a conductive butterfly connector which has a body with a central portion and opposed wings.

20. The flexible printed circuit of claim 19, wherein the body of the butterfly connector defines a connector conductive circuit, and the electrical component is positioned on the central portion and the wings are attached to the flexible conductive circuit.

21. The flexible printed circuit of claim 1, wherein crossing of conductive pathways on the flexible conductive circuit is accomplished by spot positioning a bridge of a dielectric insulating layer over one of the conductive pathways, with a conductive cross-over path crossing the conductive pathway via the bridge.

22. The flexible printed circuit of claim 1, wherein the flexible supporting substrate is a film which has a thickness of between 25 um and 250 um.

23. The flexible printed circuit of claim 1, wherein there is more than one of the flexible conductive circuit, namely:
a first flexible conductive circuit on the first face and a second flexible conductive circuit on the second face of the flexible supporting substrate,
micro-holes are formed and a very low viscosity conductive used to penetrate through the micro-holes and electrically join together the first flexible conductive circuit and the second flexible conductive circuit.

24. The flexible printed circuit of claim 1, wherein the flexible supporting substrate with flexible conductive circuit and graphic overlay sheet forms a point of purchase display.

25. The flexible printed circuit of claim 1, wherein the flexible supporting substrate with flexible conductive circuit and graphic overlay sheet forms a sign or a banner.

26. The flexible printed circuit of claim 1, wherein the graphic overlay sheet is rigid and is segmented to facilitate folding.

27. A method of fabricating a flexible printed circuit, the method comprising:
providing a feed roll containing a flexible supporting substrate, the flexible supporting substrate having a first face, a second face and a flexible conductive material deposited through vacuum deposition on at least one of the first face or the second face; and
feeding the flexible supporting substrate from the feed roll across a work table positioned in an air filled room as a flexible conductive circuit is formed on the flexible conductive material by electrical discharge machining, and the flexible conductive circuit defining a plurality of electrical component placement circuits to which electrical components may be attached.

28. The method of claim 27, wherein the flexible supporting substrate has graphic printing on one of the first face or the second face and the flexible conductive circuit on the other of the first face or the second face.

* * * * *